US012686938B2

(12) United States Patent
Zhu et al.

(10) Patent No.: US 12,686,938 B2
(45) Date of Patent: Jul. 21, 2026

(54) WAFER HOLDER AND METHOD

(71) Applicant: PORO TECHNOLOGIES LTD, Cambridge (GB)

(72) Inventors: Tongtong Zhu, Cambridge (GB); Yingjun Liu, Cambridge (GB)

(73) Assignee: Poro Technologies LTD, Cambridge (GB)

( * ) Notice: Subject to any disclaimer, the term of this patent is extended or adjusted under 35 U.S.C. 154(b) by 794 days.

(21) Appl. No.: 17/997,318

(22) PCT Filed: Apr. 28, 2021

(86) PCT No.: PCT/GB2021/051025
§ 371 (c)(1),
(2) Date: Oct. 27, 2022

(87) PCT Pub. No.: WO2021/219997
PCT Pub. Date: Nov. 4, 2021

(65) Prior Publication Data
US 2023/0167576 A1 Jun. 1, 2023

(30) Foreign Application Priority Data
Apr. 28, 2020 (GB) ...................................... 2006255

(51) Int. Cl.
*C25F 7/00* (2006.01)
*C25F 3/12* (2006.01)
*H10P 50/00* (2026.01)

(52) U.S. Cl.
CPC .................. *C25F 7/00* (2013.01); *C25F 3/12* (2013.01); *H10P 50/00* (2026.01)

(58) Field of Classification Search
CPC . H01L 21/762; H01L 21/687; H01L 21/6833; H01L 21/6835; H01L 21/6831; H01L 21/68; H10P 72/50; H10P 72/00
See application file for complete search history.

(56) References Cited

U.S. PATENT DOCUMENTS 3,630,804 A * 12/1971 Coffman ............... H01L 21/306
156/345.23
5,262,029 A * 11/1993 Erskine ............. H01L 21/68735
118/503
(Continued)

FOREIGN PATENT DOCUMENTS

EP 1220307 7/2002
JP 2003-342799 12/2003
(Continued)

OTHER PUBLICATIONS

International Search Report and Written Opinion of PCT/GB2021/051025, Jul. 26, 2021 26 pages.

*Primary Examiner* — Lee D Wilson
(74) *Attorney, Agent, or Firm* — Merchant and Gould, PC

(57) ABSTRACT

A wafer holder for holding a semiconductor wafer during electrochemical porosification with an electrolyte includes a housing for receiving the semiconductor wafer, an aperture in the housing, through which an upper surface of the semiconductor wafer is exposable to the electrolyte, a seal extending around the aperture, for preventing the ingress of electrolyte into the housing; and an electrical contact for making an electrical connection with the semiconductor wafer. A method of electrochemical porosification of a semiconductor wafer includes placing a semiconductor wafer in the wafer holder; immersing the housing in an electrolyte, so that the surface of the semiconductor wafer is exposed to electrolyte through the aperture; and applying a potential difference between the semiconductor wafer and the electrolyte.

23 Claims, 6 Drawing Sheets

(56)     References Cited

U.S. PATENT DOCUMENTS

| | | | |
|---|---|---|---|
| 2004/0182321 A1* | 9/2004 | Kuibira | H01L 21/68792 |
| | | | 118/728 |
| 2004/0187791 A1* | 9/2004 | Busse | H01L 21/6838 |
| | | | 118/728 |
| 2016/0215408 A1* | 7/2016 | Kagajwala | C25D 17/10 |
| 2020/0090941 A1 | 3/2020 | Nouri et al. | |
| 2020/0173052 A1* | 6/2020 | Fortner | C25D 5/08 |
| 2022/0372647 A1* | 11/2022 | Seki | C25D 17/001 |
| 2023/0167576 A1* | 6/2023 | Zhu | H01L 21/306 |
| | | | 205/655 |

FOREIGN PATENT DOCUMENTS

| | | |
|---|---|---|
| TW | I670491 B | 9/2019 |
| TW | 202022370 A | 6/2020 |
| WO | 01/91170 A1 | 11/2001 |
| WO | 2011/094391 | 8/2011 |
| WO | 2019/063957 | 4/2019 |
| WO | 2019/145728 | 8/2019 |

* cited by examiner

700

710

810

800

-820-

WAFER HOLDER AND METHOD

The invention relates to a wafer holder for holding a semiconductor wafer during electrochemical porosification with an electrolyte, and to a method of electrochemical porosification of a semiconductor wafer.

BACKGROUND

Electrochemical porosification, or "etching" is a known technique for the production of porous III-nitride semiconductor structures. In this technique, a III-nitride semiconductor sample is partially immersed in an electrolyte (or "etchant") liquid, and used as the anode in an electrochemical cell. A potential difference is applied between the sample and the electrolyte, causing the electrolyte to selectively porosify portions of the semiconductor sample that have a high charge carrier concentration. Typically layered semiconductor samples are used, so that layers with different charge carrier concentrations are porosified to different degrees.

One prior art document that discloses the possibility of generating nanoporous GaN by an electrochemical etching method is WO2011/094391A1, in which n-type doped GaN is etched to generate porosity by contacting the n-type doped GaN with an electrolyte and applying an etching potential. WO2011/094391A1 (paragraph [0031]) describes the etching of two types of GaN structure. In a first type, the surface of an exposed layer of n-type doped GaN is contacted with an electrolyte and etched, generating a porous layer. Etching proceeds perpendicularly to the layer surface and in WO2011/094391A1 is termed vertical etching. In a second type of structure a top layer of undoped GaN is formed over a layer of n-type doped GaN. The n-type doped GaN thus forms a sub-surface layer. The layers are then dry etched, or cleaved, to form trenches which expose edges or side-walls of the layers, and these edges can be exposed to an electrolyte. Etching then proceeds selectively through the n-type layer, from its exposed edge, porosifying the doped sub-surface layer but not the overlying undoped layer. In WO2011/094391A1 this is termed horizontal or lateral etching.

Electrochemical etching of n-type GaN has been further described in a variety of academic papers which follow the teaching of WO2011/094391A1 that etching can either be performed "vertically", directly into an exposed n-type GaN surface, or "horizontally", into the edges of an n-type GaN layer sandwiched between two layers of undoped GaN and/or an electrically insulating base layer.

More recently, WO2019/063957A1 disclosed electrochemical porosification of a sub-surface III-nitride structure, by etching through a surface layer with a low charge carrier density. Unlike the "horizontal" etching methods of other prior art documents, the method of WO2019/063957A1 allowed sub-surface structures to be porosified without the need for the sub-surface structures to be in direct contact with the etching electrolyte. In this method, the sub-surface structure is porosified by electrochemical etching, while the surface layer is not porosified.

In the prior art, little attention has been paid to how best to apply the potential difference to the semiconductor sample. As the prior art has typically been confined to porosifying relatively small experimental-scale samples, a solution has yet to be developed for applying electrical current to porosify full-scale semiconductor wafers.

A typical prior art approach to forming an electrical connection with the semiconductor sample to be porosified has been to solder an electrical contact (usually indium wire) to the edge of a sample before partially immersing the sample in liquid electrolyte, while keeping the electrical contact above the surface of the electrolyte. The samples being tested are typically flat and very thin multi-layered structures, so forming an electrical connection with the side, or edge, of the sample means that a direct connection is formed with every n-type GaN layer that is meant to be porosified. This is taught to be desirable in the prior art.

The present inventors have found, however, that porosification performed in this manner is not particularly uniform over large samples. Non-uniform porosification was identified in particular at the surface of the liquid electrolyte, and around the edges of the sample.

Unlike in the WO2011/094391A1 technique where trenches are etched into the sample to allow electrolyte horizontal access into the n-doped layers of the sample, the technique of WO2019/063957A1 has been demonstrated to enable porosification of large-scale wafers without pre-patterning of trenches.

If the WO2019/063957A1 technique is performed by contacting an edge of a wafer and "dipping" the rest of the wafer into an electrolyte, however, the porosification around the wafer edge and at the liquid surface is not as uniform as desired. While high-quality uniform porosification is achieved across the majority of the wafer, the wafer can be porosified to a different extent in a narrow region around the exposed wafer edge, presumably due to both "vertical" and "horizontal" etching mechanisms taking place at the wafer edge.

SUMMARY OF INVENTION

The present application relates to a wafer holder for holding a semiconductor wafer during electrochemical treatment with an electrolyte, to use of the wafer holder, and to a method of electrochemical treatment of a semiconductor wafer.

The invention is defined in the independent claims, to which reference should now be made. Preferred or advantageous features of the invention are defined in the appended sub-claims.

According to a first aspect of the invention there is provided a wafer holder for holding a semiconductor wafer during electrochemical porosification with an electrolyte. The wafer holder comprises:

a housing for receiving the semiconductor wafer;

an aperture in the housing, through which an upper surface of the semiconductor wafer is exposable to the electrolyte;

a seal extending around the aperture, for preventing the ingress of electrolyte into the housing; and an electrical contact for making an electrical connection with the semiconductor wafer.

The exposed surface of the semiconductor wafer may be termed an "upper" surface of the semiconductor wafer. Semiconductor wafers are typically flat and thin, so that they may be considered to have a lower surface which typically comprises a substrate for epitaxial growth, an upper surface, and a thin "vertical" edge around the perimeter of the wafer. The semiconductor wafer may comprise multiple layers of semiconductor material, and the "upper surface" may be a surface of the surface layer of semiconductor material. It is this surface that is intended to be exposed to electrolyte liquid in order for electrochemical porosification of sub-surface layers or structures to take place by "through-surface" etching as described in WO2019/063957A1.

By providing a housing for receiving the semiconductor wafer, the wafer holder advantageously enables uniform porosification across a large-scale semiconductor wafer. Providing a housing for the wafer, and an aperture so that electrolyte can only contact the exposed upper surface of the wafer, allows the semiconductor wafer to be porosified solely via the through-surface etching mechanism of WO2019/063957A1.

The wafer holder provides a convenient and repeatable way of mounting standard-sized semiconductor wafers for porosification. The aperture means that the same area of each wafer surface is exposed to electrolyte, and prevents "horizontal" etching from the wafer edges from creating non-uniform porosities around the wafer edge.

In use, the housing may be immersed, or submerged, in electrolyte liquid, so that electrolyte liquid contacts the area of the semiconductor wafer that is exposed through the aperture in the housing. The exposed area of wafer is therefore porosified by the through-surface etching mechanism of WO2019/063957A1.

The housing may comprise a seal extending around the aperture, for sealing the housing around the semiconductor wafer and preventing the ingress of electrolyte into the housing. The seal is preferably configured to seal against the upper surface of the wafer. This means that electrolyte cannot contact the area of the wafer surface beyond the seal, so the portion of the wafer outside the seal is not porosified. However, the portion of the wafer inside the seal is exposed to electrolyte, and is uniformly porosified by through-surface porosification.

Sealing the housing around the wafer is desirable in order to ensure good compression of the wafer, in order to allow sufficient contact between the electrical contacts and the wafer, and in order to keep electrolyte liquid out of the housing.

In a preferred embodiment of the wafer holder, resilient o-rings are used to form seals.

The electrical contact is preferably configured to contact the upper surface of the semiconductor wafer, and/or an outer edge of the semiconductor wafer. Providing electrical contacts which contact the upper surface or the edge of the wafer may advantageously ensure that the wafer holder is usable with wafers regardless of the type of substrate on which the wafer has been grown. For example, Ill-nitride semiconductor wafers may be formed on non-conductive substrates, such as sapphire, silicon, or SiC, or alternatively on a conductive bulk GaN substrate. Forming an electrical connection with the upper surface or sides of the wafer makes the holder suitable for use with any of these possibilities.

The most preferred option may be to configure the electrical contact to contact the upper surface of the semiconductor wafer, as this may advantageously provide the most repeatable and controllable electrical connection between the wafer holder and the wafer itself.

The electrical contact may advantageously be a non-permanent contact configured to form an electrical connection with the wafer without requiring a permanent physical connection such as solder. The electrical contact may be formed, for example, from metal, carbon, or any other suitable material for forming an electrical connection.

In the prior art, direct electrical connections have typically been made to each layer of a semiconductor structure by soldering an indium wire directly onto the wafer edge where each layer-edge is exposed. However, the inventors have found that more repeatable results can be achieved with an electrical contact that is biased or urged into contact with the upper surface of the semiconductor wafer. The inventors have found that making the electrical connection with an undoped surface layer, instead of forming soldered connections with the edges of each individual layer, still creates the required potential difference between the sub-surface layer (s) and the electrolyte, so that electrochemical porosification of the sub-surface layers is successful.

The electrical contact is preferably configured to make an electrical connection with the surface layer of the semiconductor wafer between the seal and the edge of the wafer surface. Thus the electrical contact makes a connection with the upper surface of the wafer, but in an area that is not in contact with electrolyte. This advantageously prevents corrosion of the electrical contacts being caused by the electrolyte.

The housing is preferably sealable so that the edges of the semiconductor wafer are not exposable to the electrolyte. This prevents the "horizontal" etching mechanism of WO2011/094391A1 from taking place at the edges of the wafer, and therefore prevents the non-uniform porosity at the wafer edges that can occur with the prior art "dipping" immersion technique.

The aperture is preferably configured to be smaller than the surface of the semiconductor wafer to be received in the housing, so that only a portion of the surface of the semiconductor wafer is exposable to the electrolyte. Preferably the aperture is the same shape as the wafer to be porosified. Thus the aperture being smaller than the wafer surface means that a central portion of the wafer is exposable to electrolyte through the aperture, while a border portion around the perimeter of the wafer is not exposable to electrolyte and is therefore not porosified.

The electrical contact is preferably configured to make an electrical connection with a portion of the surface of the semiconductor wafer that is not exposed to the electrolyte. Preferably the electrical contact is positioned to make an electrical connection with the border portion around the perimeter of the wafer is not exposable to electrolyte.

The electrical contact is provided in a sealed portion of the housing, so that the electrical contact is not exposable to electrolyte. This may advantageously prevent corrosion of the electrical contact.

The electrical contact is preferably configured to be biased or urged against the surface of the semiconductor wafer. For example, the contact may be sprung so that it is biased against the wafer when the wafer is placed in the housing. This may advantageously provide a reliable and consistent electrical connection which can quickly form an electrical connection with a semiconductor wafer placed in the wafer holder, without requiring a physical connection, such as the soldered connections used in the prior art.

In a preferred embodiment, the housing may comprise a plurality of electrical contacts arranged to contact the surface of the semiconductor wafer at a plurality of positions around its perimeter. This may advantageously allow much more uniform current distribution across the wafer, and therefore more uniform porosification, than was possible with the single edge-mounted electrical connections of the prior art.

The housing may, for example, comprise two, or three, or four, or five, or six or eight or more electrical contacts arranged around the housing for contacting the surface of the semiconductor wafer at a plurality of positions around its perimeter.

The plurality of electrical contacts may be spaced evenly around the housing to contact the surface of the semiconductor wafer at a plurality of equidistant positions.

The housing may be configured to receive a circular semiconductor wafer. This may advantageously make the wafer holder usable for porosifying the circular wafers that are conventionally used in semiconductor processing. For example, the housing may be configured to receive a circular semiconductor wafer with a radius R, and the aperture may be a circular aperture with a radius r, in which r<R.

The housing may be configured to receive a semiconductor wafer with a diameter of 1 inch (2.54 cm), or 2 inches (5.08 cm), or 6 inches (15.24 cm), or 8 inches (20.36 cm), or 12 inches (30.48 cm) or 16 inches (40.72 cm) for example.

The housing may alternatively be configured to receive a semiconductor wafer of a different shape. For example, a square housing with a square aperture could be used to receive a square wafer for porosification.

The housing is preferably openable for convenient insertion and removal of semiconductor wafers.

In a preferred embodiment, the housing may comprise a backing section for contacting the bottom surface of the semiconductor wafer, and a front section comprising the aperture, for contacting the upper surface of the semiconductor wafer. The backing section and the front section of the housing are preferably connectable to one another by a plurality of releasable connections, for example screws or bolts. One or more seals may be provided to ensure that the housing is water-tight when the backing section is connected to the front section.

The backing section of the housing may comprise a compressible member for supporting the bottom surface of the semiconductor wafer. The compressible member may advantageously cushion and protect the delicate wafer from the rigid material of the housing, and may compress when the two parts of the housing are tightened and connected together. For example, a resilient o-ring may be provided on the backing section, so that the wafer is supported on the o-ring when it is inserted into the housing.

The wafer preferably comprises an electrical lead for connecting the electrical contacts to a power source.

The housing is preferably formed from acid-resistant plastic. The electrolytes used for electrochemical porosification are typically acids, so the use of an acid-resistant plastic prolongs the lifetime of the device.

According to a second aspect of the invention there is provided a method of electrochemical porosification of a semiconductor wafer, comprising the steps of:

placing a semiconductor wafer in a wafer holder according to the first aspect of the invention;

immersing the housing in an electrolyte, so that the surface of the semiconductor wafer is exposed to the electrolyte through the aperture; and applying a potential difference between the semiconductor wafer and the electrolyte.

In a preferred embodiment, the step of placing the semiconductor wafer in the wafer holder may involve separating the backing section and the front section of the housing by releasing the connectors, placing the semiconductor wafer onto the backing section so that the upper surface of the wafer (that is, the surface of the wafer through which etching is to proceed) faces away from the backing section, and then placing the front section over the wafer so that the central region of the wafer surface is visible through the aperture in the holder. Preferably, placing the front section on the semiconductor wafer automatically causes the electrical contact to contact the surface of the wafer. The connectors are then re-tightened to connect the front section to the backing section.

The features and steps necessary to porosify sub-surface structures of III-nitride semiconductor material are set out in WO2019/063957A1. A variety of wafer structures may be formed and porosified in the present wafer holder, using the technique set out in WO2019/063957A1. As the specific requirements of wafer design and the etching technique are known from WO2019/063957A1 for example, they will not be discussed in great detail here.

The semiconductor wafer may comprise a sub-surface structure of a first III-nitride material, having a charge carrier density greater than $5 \times 10^{17}$ cm$^{-3}$, beneath a surface layer of a second III-nitride material, having a charge carrier density of less than $1 \times 10^{17}$ cm$^{-3}$. When the wafer surface is exposed to electrolyte and a potential difference is applied, the sub-surface structure is then porosified by electrochemical etching, while the surface layer is not porosified.

The potential difference is preferably applied between the surface layer of the semiconductor wafer and the electrolyte. The surface layer is preferably undoped, or not-intentionally-doped, and preferably has a charge carrier density of less than $1 \times 10^{17}$ cm$^{-3}$.

The surface layer and the sub-surface structure preferably comprise III-nitride materials selected from the list consisting of: GaN, AlGaN, InGaN, InAlN and AlInGaN.

Preferably the semiconductor wafer is not patterned with trenches. For example, preferably the semiconductor wafer comprises a continuous upper surface, or upper layer, of semiconductor material. Particularly preferably the semiconductor wafer comprises a continuous upper surface, or upper layer, of III-nitride semiconductor material, formed from undoped, or non-intentionally-doped III-nitride material. Undoped, or non-intentionally-doped III-nitride material is not porosified during electrochemical porosification, but allows through-surface porosification as set out in WO2019/063957A1. In order to not be porosified during treatment, the upper surface of III-nitride material should preferably have a charge carrier density of less than $1 \times 10^{17}$ cm$^{-3}$.

The porosification method may include photo-electrochemical etching. For example, the method may comprise the step of photo-electrochemically etching the semiconductor wafer by illuminating the surface of the semiconductor wafer while the potential difference is applied. The sample may be illuminated with UV illumination during electrochemical etching.

Electrochemical etching may be carried out in a variety of acidic or basic electrolytes. For example, suitable electrolytes include Oxalic acid, KOH, NaOH, HF, HCl, and HNO$_3$.

In order to electrochemically etch a sample, an electrochemical cell is arranged so that the sample in the wafer holder acts as an anode, and an inert electrode such as a platinum foil electrode serves as a cathode. The sample and the platinum electrode are connected to a power supply, and the wafer holder is immersed, or partially immersed, in the electrolyte so that the wafer surface is exposed to electrolyte through the aperture, and the cell forms a circuit.

In order to perform electrochemical etching, the power supply is controlled to apply a potential difference (voltage) between the semiconductor wafer and the electrolyte, causing a current to flow through the electrolyte and the sample. The flow of current through the sample causes electrochemical etching of any sub-surface structures with a charge carrier density greater than $5 \times 10^{17}$ cm$^{-3}$, such that the porosity of these layers increases.

Preferably the applied potential difference between the sub-surface structure and the electrolyte is at least 4 volts (v), or 6 V, or 8V, or 10 V, or 15 V and/or less than 20 V, or 25 V, or 30 V in order to selectively porosify the sub-surface structure.

Electrochemical etching may be carried out in continuous or pulsed modes, and may be controlled by controlling the voltage or current across the cell.

Advantageously, the progress of the etching reaction may be monitored by measuring the etching current during the reaction.

After etching, samples can be cleaned by rinsing in deionized water and drying with $N_2$, to ensure complete dissolution of any residue etching chemicals and products, without affecting the porous structure of the sub-surface structures.

According to a third aspect of the invention there is provided a use of the wafer holder of the first aspect for electrochemical porosification of a semiconductor wafer.

Preferably the wafer holder is used to hold a III-nitride semiconductor wafer during electrochemical porosification of the wafer.

The use of the wafer holder may comprise any of the method steps of the method described above in relation to the second aspect of the invention.

According to a fourth aspect of the invention there is provided a porous semiconductor wafer formed by the method of electrochemical porosification of the second aspect. The porous semiconductor wafer may be formed by the use of the wafer holder during electrochemical porosification according to an aspect of the invention set out above.

A porous wafer porosified using the wafer holder of the present invention may be identifiable by several characteristics. For example, as the aperture and seal expose preferably only a central portion of the wafer to the electrolyte during processing, wafers porosified in the wafer holder typically comprise a border of unporosified semiconductor around the perimeter of the wafer. This unporosified region typically extends around the circumference of the wafer, and corresponds to the area of the upper surface that was occluded from contact with the electrolyte during porosification due to the seal and the size of the aperture. The width of the unporosified border may vary according to the design of the wafer holder, and how close to the wafer perimeter the seal is positioned. If the upper surface of the wafer is not patterned by trenches, this unporosified border also indicates that the porous wafer has been porosified by through-surface etching as described in WO2019/063957A1, as during porosification with the wafer holder there are no exposed edges of the semiconductor wafer into which electrolyte can penetrate for "horizontal" etching.

Preferably the porous semiconductor wafer is a III-nitride semiconductor wafer, particularly preferably an (Al,In)GaN semiconductor wafer.

Preferably the porous semiconductor wafer comprises a non-porous upper surface. Particularly preferably the porous semiconductor wafer comprises a continuous non-porous upper surface, which does not comprise any etched trenches or pathways that expose the edges or surfaces of sub-surface layers.

Preferably the semiconductor wafer is not patterned with trenches. For example, preferably the semiconductor wafer comprises a continuous upper surface, or upper layer, of semiconductor material. Particularly preferably the semiconductor wafer comprises a continuous upper surface, or upper layer, of III-nitride semiconductor material, formed from undoped, or non-intentionally-doped, Ill-nitride material. Undoped, or non-intentionally-doped, Ill-nitride material typically has a charge carrier density of less than $1 \times 10^{17}$ cm$^{-3}$ and is not porosified during electrochemical porosification, but allows through-surface porosification as set out in WO2019/063957A1.

If the upper surface of the porosified wafer is not patterned by trenches which expose sub-surface layers, and if the upper surface itself is not porous, but sub-surface structures have been porosified, then an unporosified border on the wafer is further evidence that the porous wafer has been porosified by through-surface etching as described in WO2019/063957A1. As the wafer holder prevents the edges of the semiconductor wafer from contacting the electrolyte during etching, if there are no trenches in the upper surface of the wafer then "horizontal" etching cannot have occurred, as there are no exposed sub-layer edges into which electrolyte can penetrate for "horizontal" etching.

A wafer comprising porous sub-surface structures or layers, with a continuous unporosified upper surface and an unporosified border, can therefore be identified as having been porosified by through-surface porosification using the wafer holder of the present invention.

A further feature of semiconductor wafers porosified using the present wafer holder is uniform porosification across large-scale wafers, thanks to the wafer holder giving improved current spreading around the wafer surface and the isolation of through-surface porosification as the only possible etching pathway.

These wafers may be advantageously uniform and replicable, and may beneficially perform extremely well as substrates for further overgrowth on the continuous unporosified upper surface.

BRIEF DESCRIPTION OF THE DRAWINGS

Specific embodiments of the invention will now be described with reference to the figures, in which.

Figure 1:
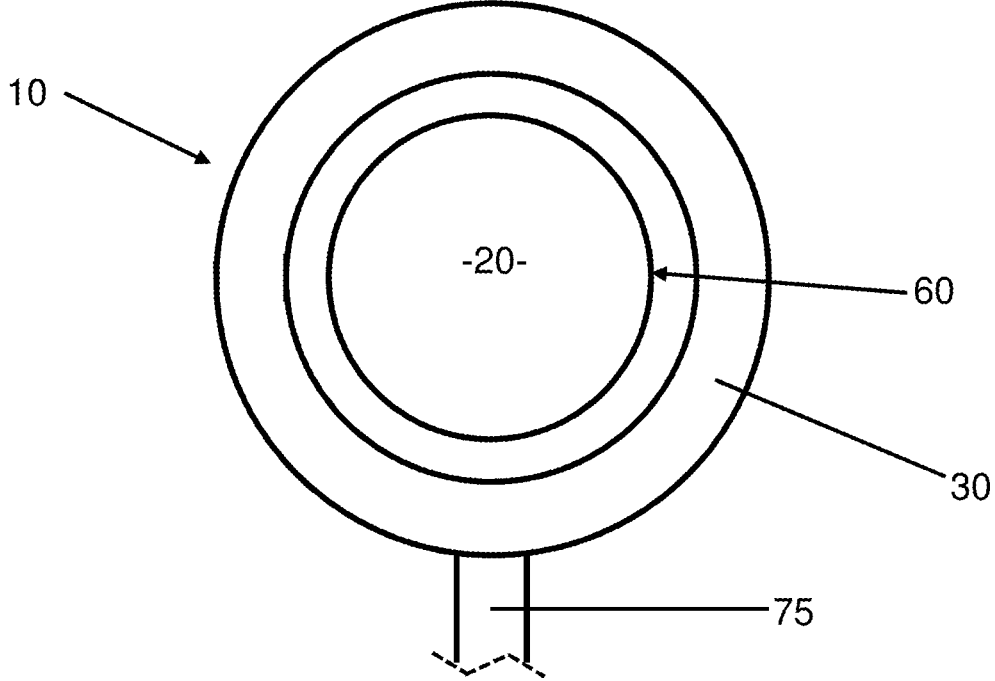
FIG. 1 shows a front view of a wafer holder according to a preferred embodiment of the present invention, with a semiconductor wafer held in the wafer holder.
Figure 2:
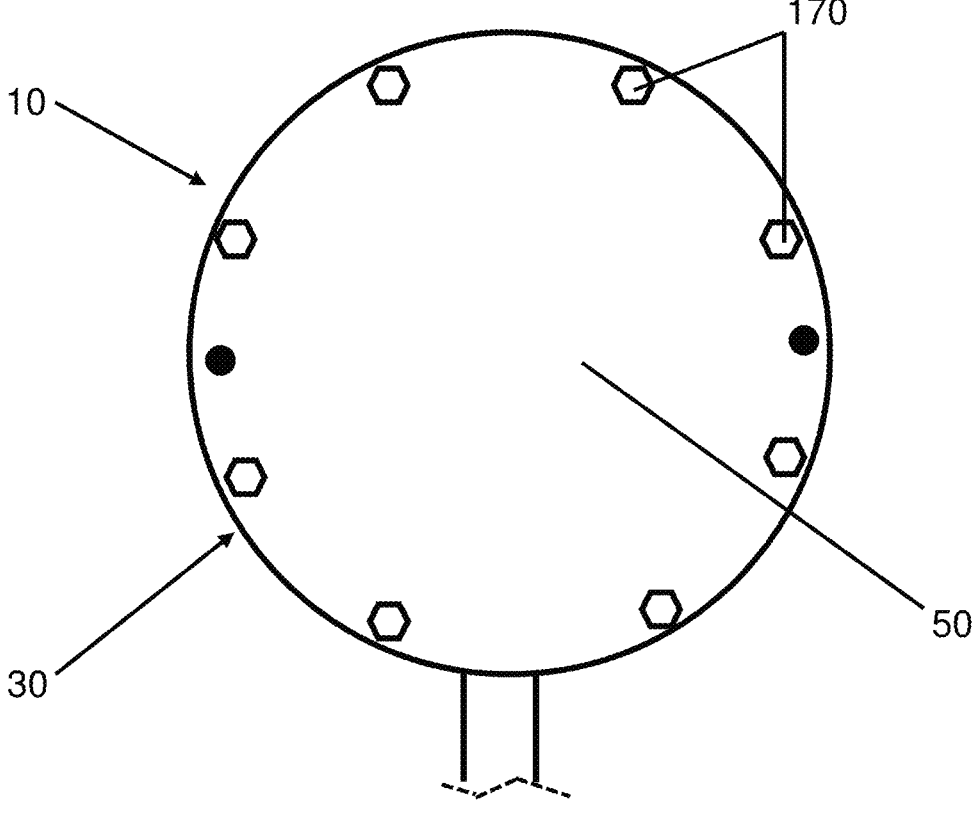
FIG. 2 shows a back view of the wafer holder of FIG. 1.
Figure 3:
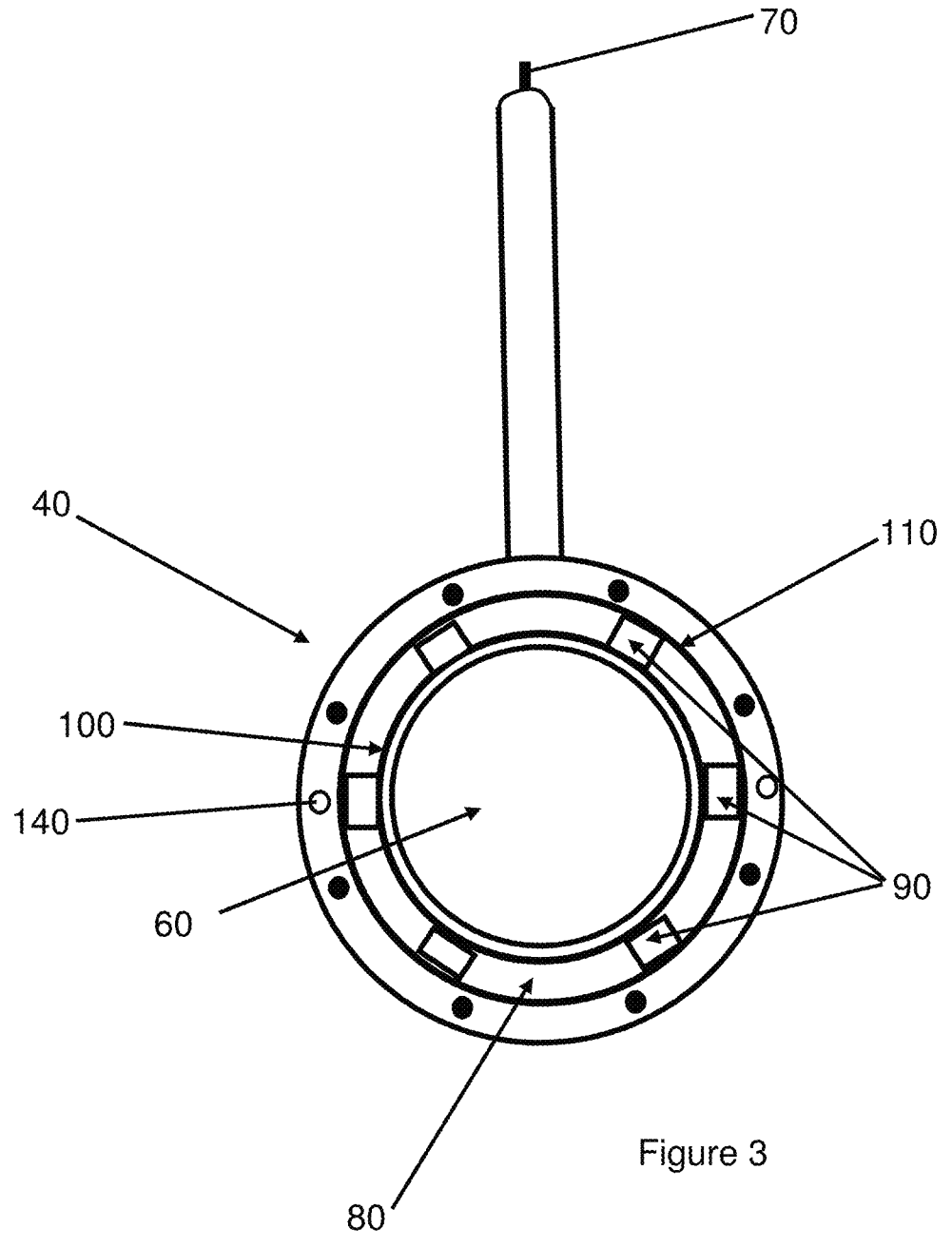
FIG. 3 is a disassembled view of the wafer holder of FIGS. 1 and 2, showing the reverse side of the front section of the wafer holder.

A wafer holder 10 for holding a circular, 4-inch diameter, semiconductor wafer 20 is shown in FIGS. 1 to 5.

The wafer holder 10 comprises a housing 30 formed from a front section 40 and a backing section 50, which are releasably connectable to one another to assemble and disassemble the housing 30.

The front section 40 of the housing is ring-shaped, with a circular aperture 60 of 3.5-inch diameter forming an opening through its centre. The outside of the front section 40, which is exposed when the housing is assembled, is formed from acid-resistant plastic. An electrical lead 70 is connected to the front section 40 through an acid-resistant plastic sheath 75. On the reverse (inside) of the front section 40, a metal ring 80 extends around the aperture 60. Six sprung metallic clips 90 are spaced evenly around the metal ring. The metallic clips 90 are electrically connected to the electrical lead 70, so that the metallic clips act as electrical contacts. A first rubber o-ring 100 extends around the aperture 60 inside the diameter of the metal ring 80, and a second rubber o-ring 110 extends around the outside of the metal ring 80.

The backing section 50 comprises a circular mount 120, around which a third rubber o-ring 130 extends.

The front section 40 comprises two projections 140 that are keyed to fit two corresponding recesses 150 in the backing section 50, and threaded holes 160 into which bolts 170 may be fitted to connect the front section with the backing section.

Figure 4:
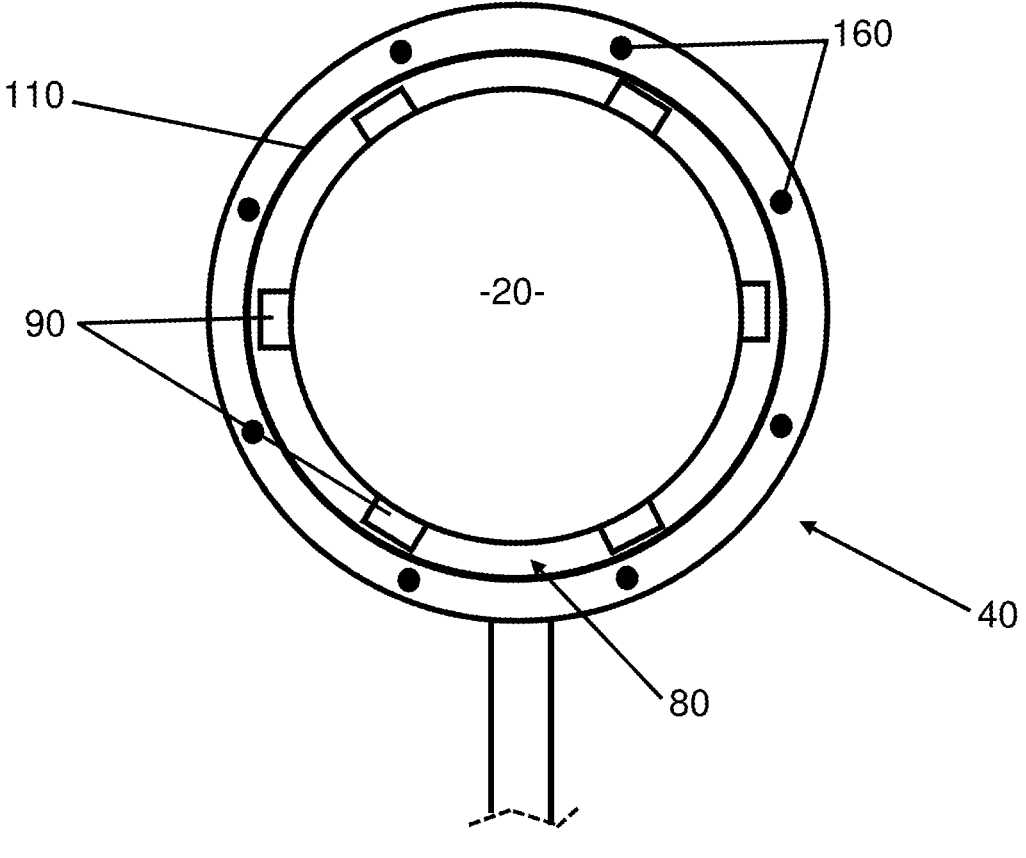
FIG. 4 shows the reverse side of the front section of the wafer holder of FIG. 3, with a semiconductor wafer in position.
Figure 5:
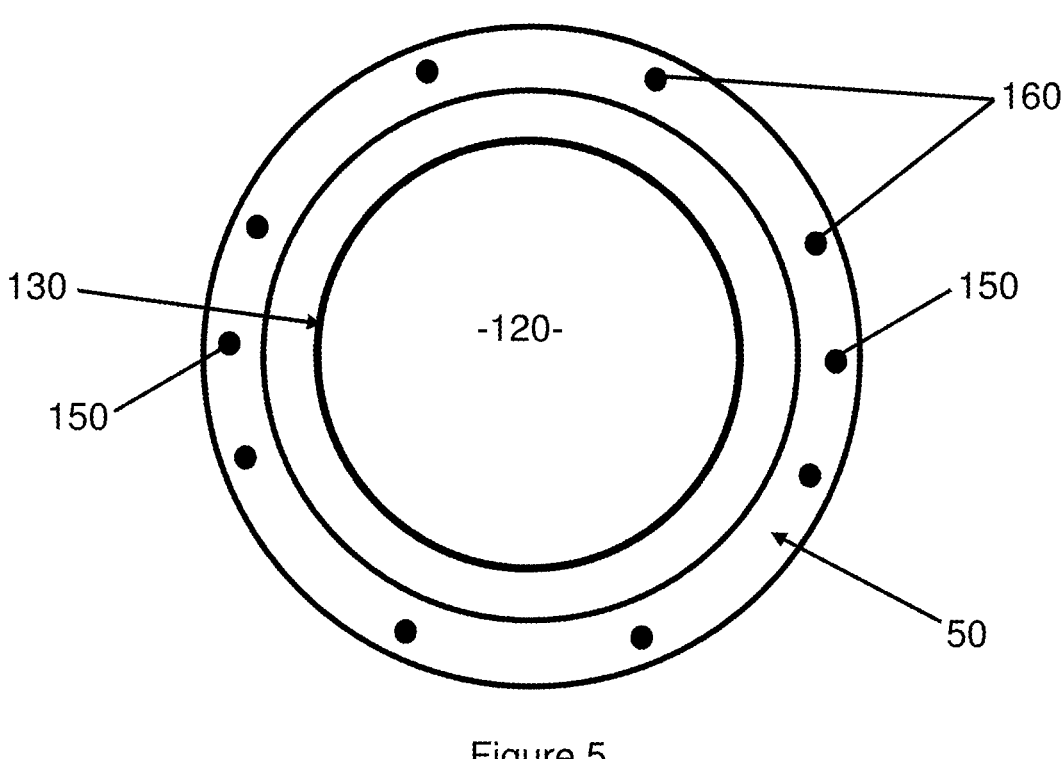
FIG. 5 is a disassembled view of the wafer holder of FIGS. 1 and 2, showing the inside of the backing section of the wafer holder.

In use, a circular 4-inch semiconductor wafer 20 is placed on the front section 40 as shown in FIG. 4, so that the upper surface of the semiconductor wafer (that is, the surface through which porosification is to proceed) faces the aperture 60. The wafer 20 is aligned with the aperture 60 so that it overlies the first o-ring 100 and contacts all six metallic clips 90. The backing-section is then placed over the wafer 20 so that the third rubber o-ring 130 contacts the bottom surface of the wafer (shown facing upwards in FIG. 4) and the projections 140 are located in the recesses 150. Bolts 170 are then fitted and tightened evenly.

As the bolts are tightened the front section 40 and the backing section 50 of the housing 30 are squeezed together, so that the semiconductor wafer 20 contacts and compresses both the first and third o-rings to form liquid-tight seals against the wafer, and the metallic clips are forced against the upper surface of the semiconductor wafer 20.

When the bolts are tightened, the o-rings are compressed so that the housing 30 is sealed against the entry of elec-trolyte liquid.

Figure 6:
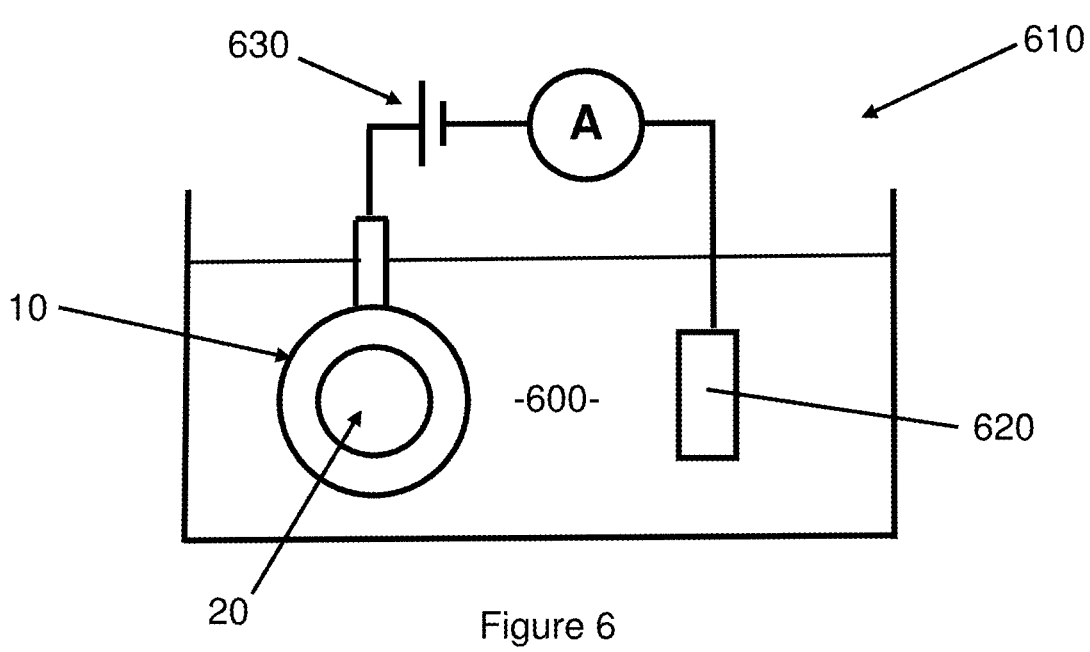
FIG. 6 is a schematic illustration of an electrochemical apparatus usable with the present invention.

In order to porosify the semiconductor wafer, the wafer holder 10 is immersed in the electrolyte liquid 600 of an electrochemical cell 610 as shown in FIG. 6. A counter electrode 620 is placed in the electrolyte, and a power source 630 is activated so that a potential difference is applied between the counter electrode and the semiconductor wafer. Porosification of the wafer 20 then proceeds as described in WO2019/063957A1.

In the exemplary embodiment illustrated in FIG. 6, a platinum foil cathode is used as the counter electrode (titanium foil/mesh may alternatively be used), 0.25 M oxalic acid is used as the electrolyte, the power source is a constant DC bias power source, and an ammeter is used to monitor and record the etching current.

As the upper surface of the wafer 20 is exposed through the aperture 60, but the rest of the wafer is sealed inside the housing 30 and thus is not in contact with the electrolyte, the electrochemical porosification process can proceed only through the upper surface of the semiconductor wafer.

Although the wafer holder is described above in relation to a 4-inch diameter wafer, the wafer holder may be pro-vided in alternative sizes to fit alternative wafer sizes and shapes.

Preferably the semiconductor wafer used in the examples is a multi-layered III-nitride semiconductor wafer, in which different layers of the wafer have different charge carrier densities, and are therefore porosified to different extents during etching.

The structure and composition of the semiconductor wafers, and the control features for the porosification method, are not particular to this invention, as the wafer holder is usable with a large variety of prior art porosifiable semiconductor structures, and with the porosification meth-ods of the prior art, in particular those set out in WO2019/063957A1.

Figure 7:
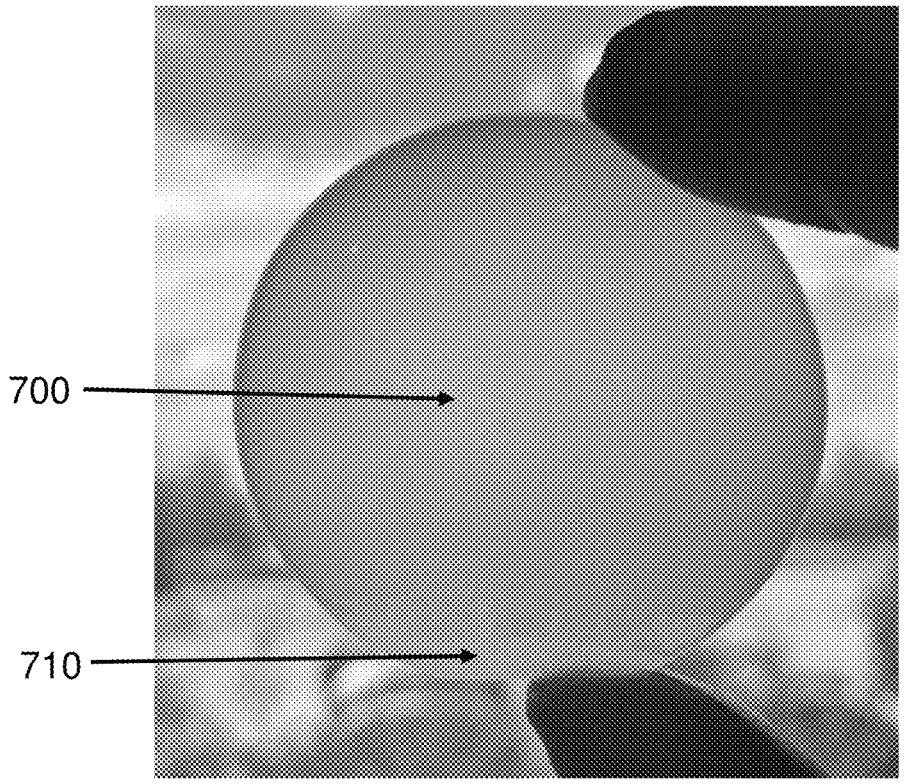
FIG. 7 is a photograph showing a semiconductor wafer porosified using the "dipping" technique of the prior art.

FIG. 7 shows a 4-inch GaN wafer 700 porosified using the prior art technique of making a single electrical connection to the edge of the wafer, and immersing the wafer by dipping into the electrolyte. Due to the change in refractive index of the semiconductor material caused by porosification, the different colours in the porosified wafer indicate different degrees of porosification at the edges of the wafer compared to the bulk material in the centre of the wafer. Also, at the bottom 710 of the wafer (as shown) where the surface of the electrolyte has been contacting the wafer during porosifica-tion, the porosification is uneven.

Figure 8:
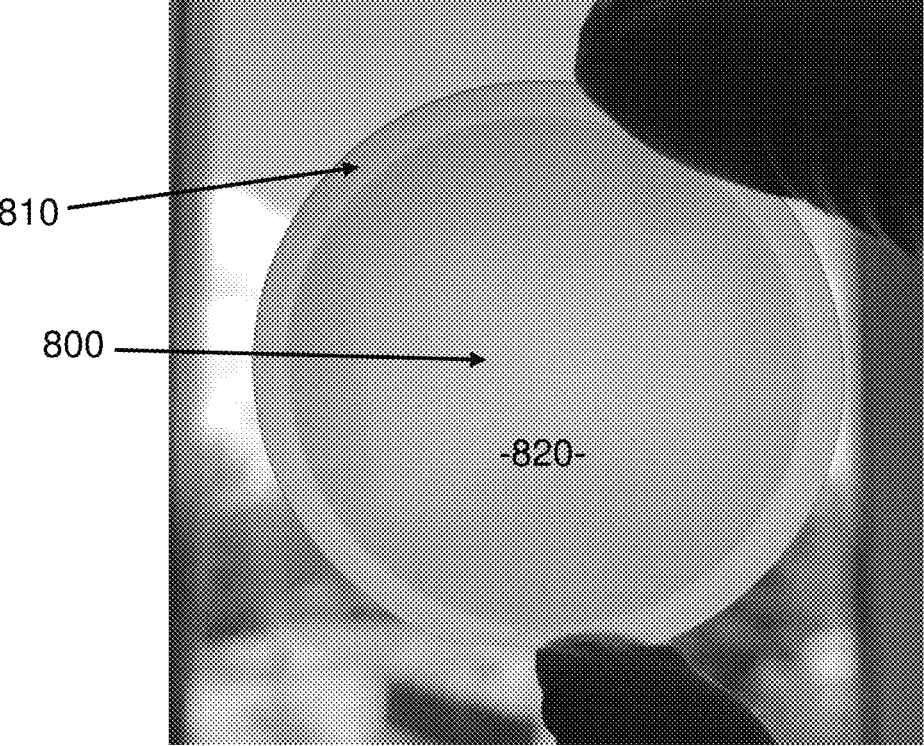
FIG. 8 is a comparative photograph showing a semiconductor wafer porosified using the wafer holder of FIGS. 1 to 5.

FIG. 8 shows a 4-inch GaN wafer 800 with the same structure as that of FIG. 7, which has been mounted in the wafer holder of the present invention during porosification. Due to the o-ring seal around the aperture 60 there is an unporosified border 810 around the perimeter of the wafer, which has been occluded from the electrolyte by the holder during porosification. However, the consistent colour of the central region 820 of the wafer 800 shows that the porosi-fication of this region, which was exposed to electrolyte through the aperture 60, is extremely uniform and consis-tent. This is attributable, for example, to the even distribu-tion of current around the wafer by the multiple electrical contacts, and to the elimination of "horizontal" etching from the edge of the wafer.

The invention claimed is:

1. A wafer holder for holding a semiconductor wafer during electrochemical porosification with an electrolyte, the wafer holder comprising:

a housing for receiving the semiconductor wafer;

an aperture in the housing, through which an upper surface of the semiconductor wafer is exposable to the electrolyte;

a seal extending around the aperture, for preventing the ingress of electrolyte into the housing; and an electrical contact for making an electrical connection with the semiconductor wafer, in which the housing comprises a backing section con-figured to contact a bottom surface of the semiconduc-tor wafer, and a front section configured to contact the upper surface of the semiconductor wafer, the front section comprising the aperture, and in which the backing section comprises a resilient o-ring configured to support the semiconductor wafer when the semicon-ductor wafer is inserted into the housing.

2. A wafer holder according to claim 1, in which the electrical contact is configured to contact the upper surface and/or an outer edge of the semiconductor wafer.

3. A wafer holder according to claim 2, in which the electrical contact is configured to make an electrical con-nection with the upper surface of the semiconductor wafer between the seal and the edge of the upper surface.

4. A wafer holder according to claim 1, in which the housing is configured so that edges of the semiconductor wafer are not exposable to the electrolyte.

5. A wafer holder according to claim 1, in which the aperture is configured to be smaller than the upper surface of the semiconductor wafer to be received in the housing, so that only a portion of the upper surface of the semiconductor wafer is exposable to the electrolyte.

6. A wafer holder according to claim 1, in which the electrical contact is configured to make an electrical connection with a portion of the semiconductor wafer that is not exposed to the electrolyte.

7. A wafer holder according to claim 1, in which the electrical contact is provided in a sealed portion of the housing, so that the electrical contact is not exposable to the electrolyte.

8. A wafer holder according to claim 1, in which the electrical contact is configured to be biased against the semiconductor wafer.

9. A wafer holder according to claim 1, in which the housing comprises a plurality of electrical contacts arranged to contact the semiconductor wafer at a plurality of positions around a perimeter of the semiconductor wafer.

10. A wafer holder according to claim 9, in which the housing comprises two, or three, or four, or five, or six or eight or more electrical contacts arranged around the housing for contacting the semiconductor wafer at a plurality of positions around the perimeter of the semiconductor wafer.

11. A wafer holder according to claim 9, in which the plurality of electrical contacts are spaced evenly around the housing to contact the semiconductor wafer at a plurality of equidistant positions.

12. A wafer holder according to claim 1, in which the housing is configured to receive a circular semiconductor wafer with a radius R, and in which the aperture is a circular aperture with a radius r, in which r<R.

13. A wafer holder according to claim 1, in which the housing is openable for insertion and removal of the semiconductor wafer.

14. A wafer holder according to claim 1, in which the backing section and the front section of the housing are connectable to one another by a plurality of releasable fasteners.

15. A wafer holder according to claim 1, comprising an electrical lead that connects the electrical contacts to a power source.

16. A wafer holder according to claim 1, in which the housing is formed from acid-resistant plastic.

17. A wafer holder according to claim 1, in which the housing is configured to receive a semiconductor wafer with a diameter of 1 inch (2.54 cm), or 2 inches (5.08 cm), or 6 inches (15.24 cm), or 8 inches (20.36 cm), or 12 inches (30.48 cm) or 16 inches (40.72 cm).

18. A method comprising using the wafer holder according to claim 1 during electrochemical porosification of a semiconductor wafer.

19. A method of electrochemical porosification of a semiconductor wafer, comprising:

placing a semiconductor wafer in the wafer holder according to claim 1;

immersing the housing in an electrolyte, so that the upper surface of the semiconductor wafer is exposed to electrolyte through the aperture; and applying a potential difference between the semiconductor wafer and the electrolyte.

20. A method according to claim 19, in which the semiconductor wafer has a sub-surface structure of a first III-nitride material, having a charge carrier density greater than $5 \times 10^{17}$ cm$^{-3}$, beneath a surface layer of a second III-nitride material, having a charge carrier density of less than $1 \times 10^{17}$ cm$^{-3}$, so that the sub-surface structure is porosified by electrochemical etching, while the surface layer is not porosified.

21. A method according to claim 20, in which the surface layer and the sub-surface structure comprise III-nitride materials selected from the list consisting of: GaN, AlGaN, InGaN, InAlN and AlInGaN.

22. A method according to claim 19, comprising photo-electrochemically etching the semiconductor wafer by illuminating the upper surface of the semiconductor wafer while the potential difference is applied.

23. A porous semiconductor wafer formed by the wafer holder method according to claim 19.

* * * * *